(12) United States Patent
Kaneko et al.

(10) Patent No.: US 11,527,386 B2
(45) Date of Patent: Dec. 13, 2022

(54) PLASMA PROCESSING APPARATUS

(71) Applicant: Tokyo Electron Limited, Tokyo (JP)

(72) Inventors: Kazushi Kaneko, Miyagi (JP); Yohei Ishida, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/193,088

(22) Filed: Mar. 5, 2021

(65) Prior Publication Data

US 2021/0280390 A1 Sep. 9, 2021

(30) Foreign Application Priority Data

Mar. 6, 2020 (JP) .............................. JP2020-038911

(51) Int. Cl.
  *H01J 37/32* (2006.01)
(52) U.S. Cl.
  CPC .. *H01J 37/32201* (2013.01); *H01J 37/32229* (2013.01); *H01J 37/32275* (2013.01); *H01J 37/32449* (2013.01)
(58) Field of Classification Search
  CPC ............. H01J 37/3299; H01J 37/32449; H01J 37/32935; H01J 37/32201; H01J 37/32275; H01J 37/32229
  See application file for complete search history.

(56) References Cited

U.S. PATENT DOCUMENTS

| 8,018,164 B2* | 9/2011 | Shannon | H05H 1/46 315/111.21 |
| 9,336,995 B2* | 5/2016 | Coumou | H01J 37/32155 |
| 10,991,550 B2* | 4/2021 | Juco | H01J 37/321 |
| 2015/0279624 A1* | 10/2015 | Toyota | H01J 37/32192 156/345.28 |
| 2018/0204708 A1* | 7/2018 | Tan | H01L 21/31138 |
| 2018/0294566 A1* | 10/2018 | Wang | H01Q 5/335 |

FOREIGN PATENT DOCUMENTS

| JP | H06-267900 A | 9/1994 |
| JP | 2012-109080 A | 6/2012 |

* cited by examiner

*Primary Examiner* — Tung X Le
(74) *Attorney, Agent, or Firm* — Pearne & Gordon LLP

(57) ABSTRACT

A microwave output device includes a microwave generator configured to generate a pulse-modulated microwave; an output unit; a first directional coupler configured to output a part of a progressive wave; and a measurement device configured to determine measurement values of High and Low levels of a power of the progressive wave. The microwave generator alternately generates a first microwave having a bandwidth and a second microwave having a single frequency peak in synchronization with switching of the High level and the Low level; averages the measurement value corresponding to the first microwave with a moving average time equal to or larger than a reciprocal of a carrier pitch; averages the measurement value corresponding to the second microwave with a moving average time less than the reciprocal of the carrier pitch; and controls the powers of High and Low levels based on the averaged measurement values and set powers.

3 Claims, 13 Drawing Sheets

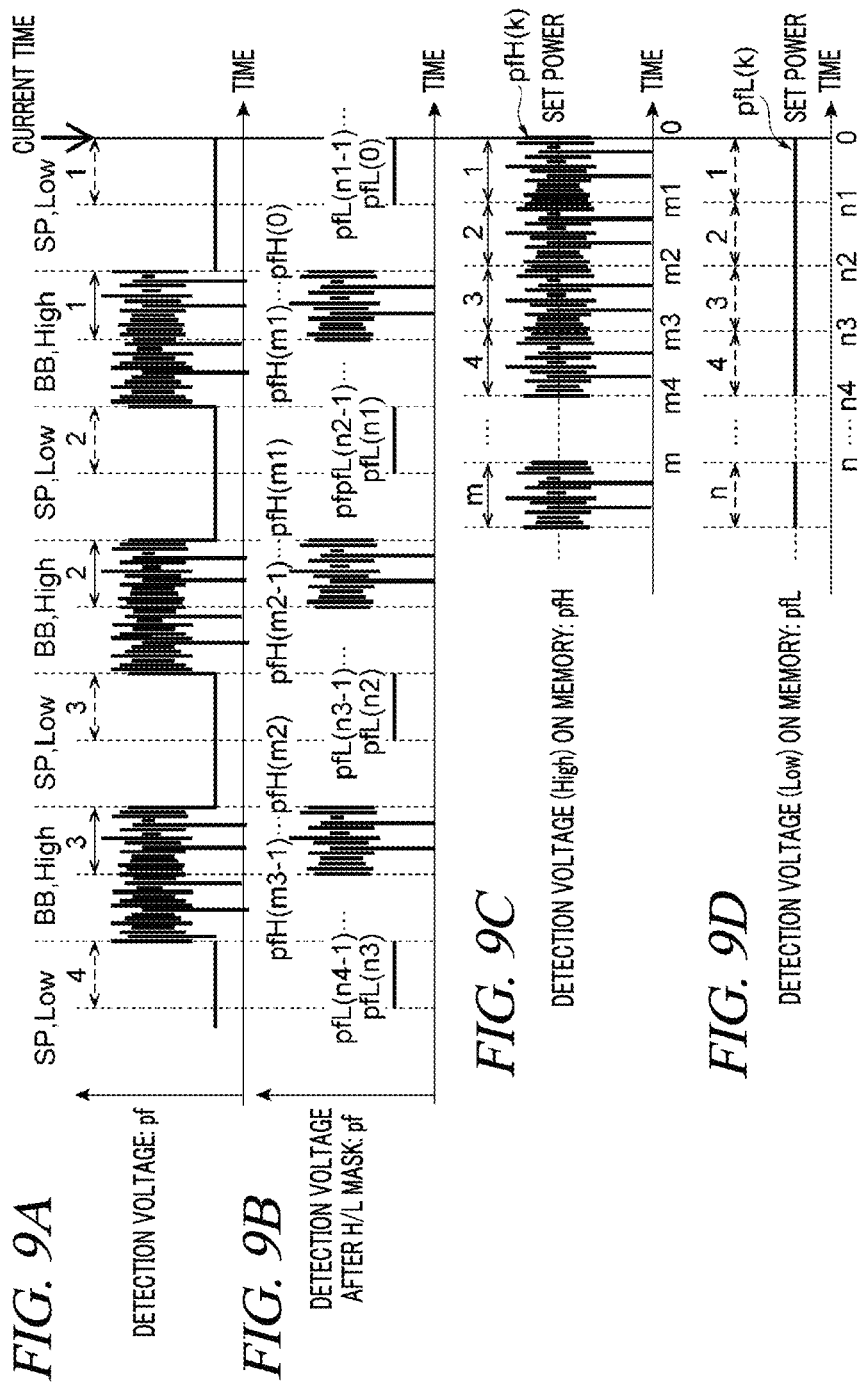

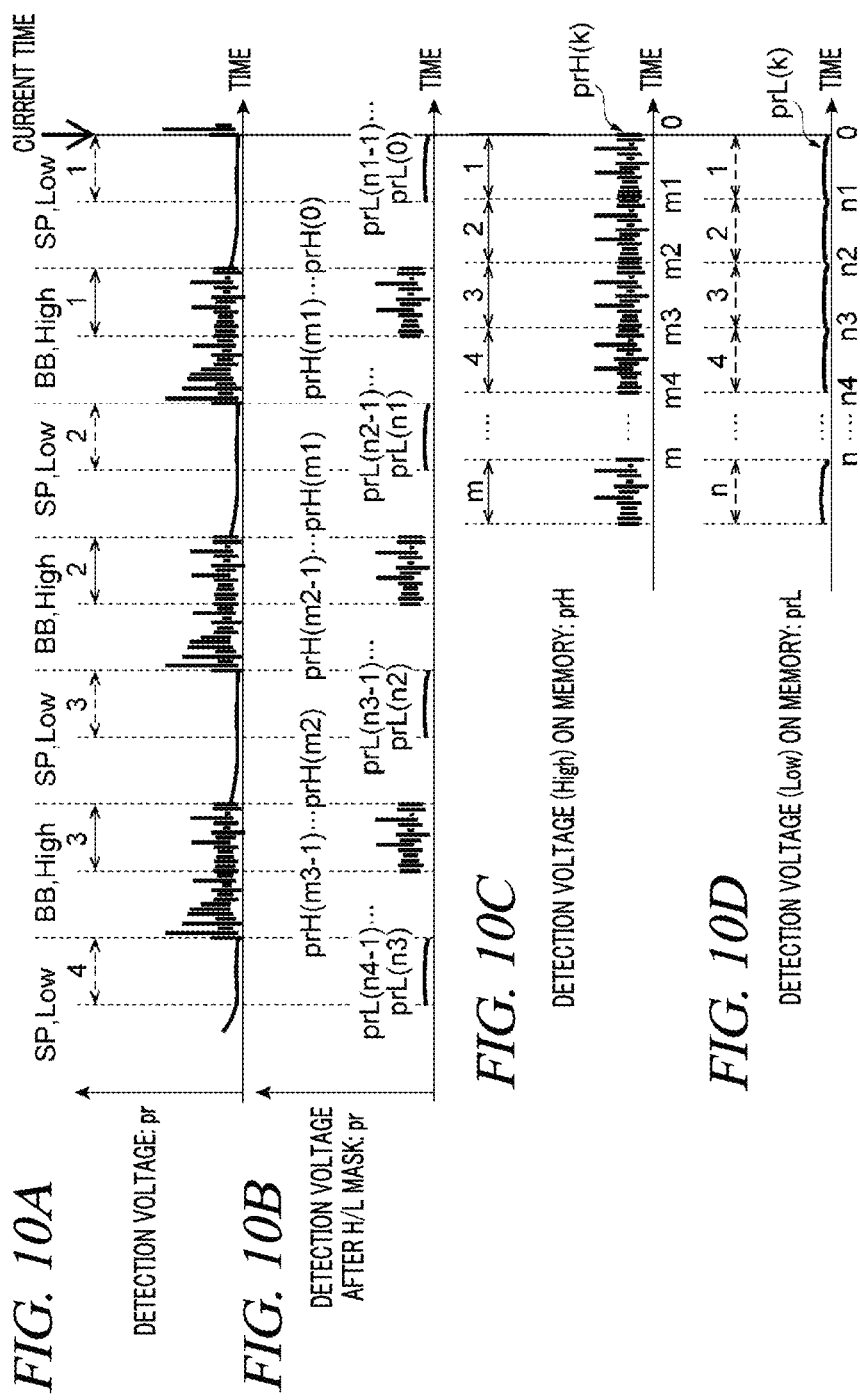

FIG. 12A
FIG. 12B
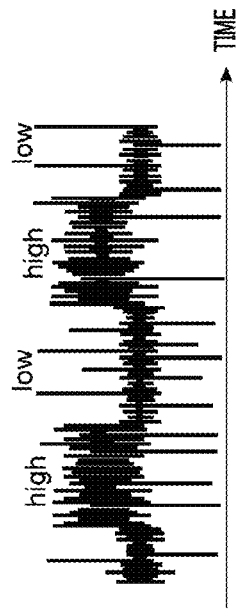
FIG. 12C
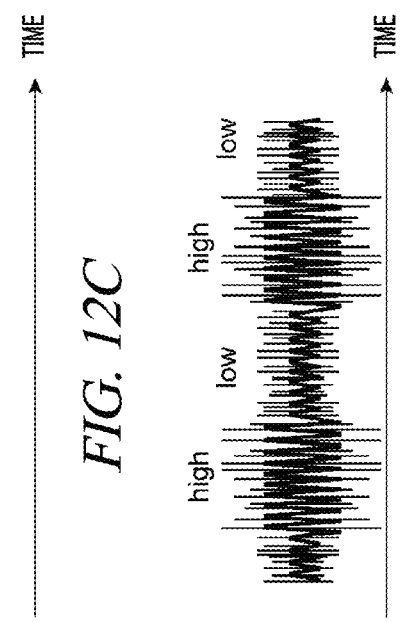
FIG. 12D
FIG. 12E
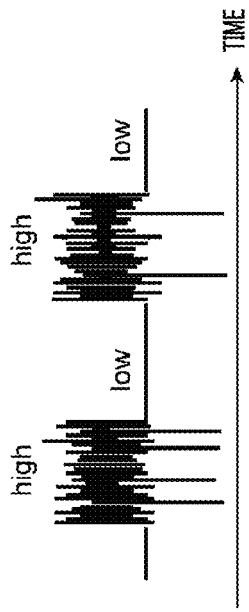
FIG. 12F
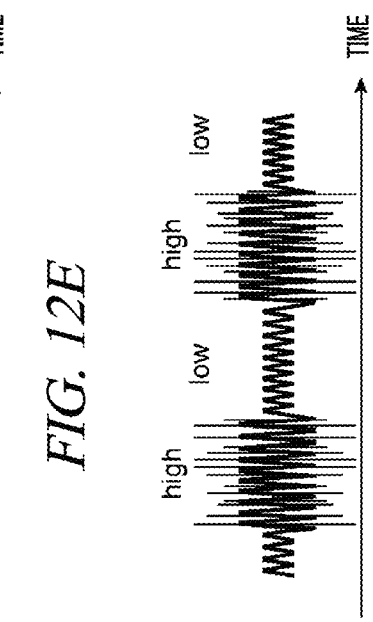

PLASMA PROCESSING APPARATUS

CROSS-REFERENCE TO RELATED APPLICATION

This application claims the benefit of Japanese Patent Application No. 2020-038911 filed on Mar. 6, 2020, the entire disclosure of which is incorporated herein by reference.

TECHNICAL FIELD

The various aspects and embodiments described herein pertain generally to a plasma processing apparatus.

BACKGROUND

In the manufacture of an electronic device such as a semiconductor device, a plasma processing apparatus is used. There are various types of plasma processing apparatuses such as a capacitively coupled plasma processing apparatus, an inductively coupled plasma processing apparatus, and so forth. Recently, a plasma processing apparatus of a type configured to excite a gas by using a microwave is also utilized.

Patent Document 1 describes such a plasma processing apparatus using a microwave. This plasma processing apparatus is equipped with a microwave output device configured to output a microwave having a bandwidth. This apparatus is capable of achieving stabilization of plasma by outputting the microwave having the bandwidth.

Patent Document 2 discloses an apparatus configured to pulse-modulate a microwave for plasma excitation. This apparatus is capable of reducing an electron temperature and an ion temperature by suppressing instability of plasma.

Patent Document 1: Japanese Patent Laid-open Publication No. 2012-109080

Patent Document 2: Japanese Patent Laid-open Publication No. H06-267900

SUMMARY

In an exemplary embodiment, a plasma processing apparatus is provided. The plasma processing apparatus includes a chamber main body and a microwave output device. The microwave output device includes a microwave generator, an output unit, a first directional coupler and a measurement device. The microwave generator is configured to generate a microwave a power of which is pulse-modulated such that the power of the microwave has a pulse frequency, a duty ratio, a High level and a Low level according to set values instructed from a controller. The set values include a set pulse frequency, a set duty ratio, a set power of High level and a set power of Low level. The output unit is configured to output the microwave propagated from the microwave generator. The first directional coupler is configured to output a part of a progressive wave propagated to the output unit from the microwave generator. The measurement device is configured to determine, based on the part of the progressive wave outputted from the first directional coupler, a first High measurement value and a first Low measurement value respectively indicating a High level and a Low level of a power of the progressive wave in the output unit. The microwave generator is configured to alternately generate a microwave of a first waveform and a microwave of a second waveform in synchronization with switching of the High level and the Low level of the power. The microwave of the first waveform has a median frequency, a bandwidth and a carrier pitch according to a set frequency, a set bandwidth and a set carrier pitch instructed from the controller, respectively. The microwave of the second waveform has a single frequency peak at a median frequency according to the set frequency instructed from the controller. The measurement device averages, between the first High measurement value and the first Low measurement value, the measurement value corresponding to the microwave of the first waveform with a moving average time equal to or larger than a reciprocal of the set carrier pitch and a preset sampling number. The measurement device averages, between the first High measurement value and the first Low measurement value, the measurement value corresponding to the microwave of the second waveform with a moving average time less than the reciprocal of the set carrier pitch and a preset sampling number. The microwave generator controls the power of the High level of the pulse-modulated microwave based on the averaged first High measurement value and the set power of High level. The microwave generator controls the power of the Low level of the pulse-modulated microwave based on the averaged first Low measurement value and the set power of Low level.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 9A to FIG. 9D are diagrams for describing an example of a detection voltage of a progressive wave of a microwave when the power modulation is performed;

FIG. 10A to FIG. 10D are diagrams for describing an example of a detection voltage of a reflection wave of the microwave when the power modulation is performed;

FIG. 12A to FIG. 12F illustrate waveforms showing examples of samplings by a measurement device.

DETAILED DESCRIPTION

Figure 1:
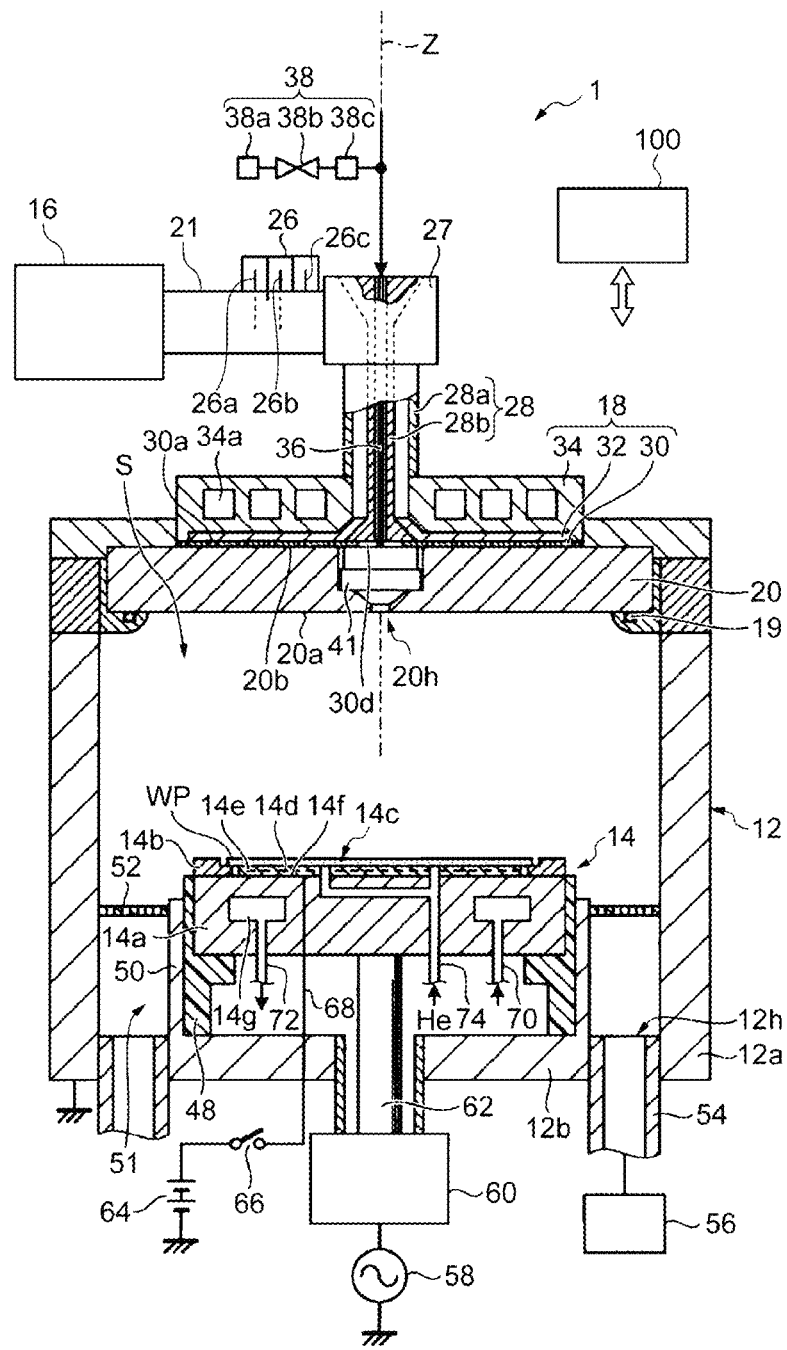
FIG. 1 is a diagram illustrating an example of a plasma processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments will be described.

In one exemplary embodiment, a microwave output device is provided. The microwave output device includes a microwave generator, an output unit, a first directional coupler and a measurement device. The microwave generator is configured to generate a microwave a power of which is pulse-modulated such that the power of the microwave has a pulse frequency, a duty ratio, a High level and a Low level according to set values instructed from a controller. The set values include a set pulse frequency, a set duty ratio, a set power of High level and a set power of Low level. The output unit is configured to output the microwave propagated from the microwave generator. The first directional coupler is configured to output a part of a progressive wave propagated to the output unit from the microwave generator. The measurement device is configured to determine, based on the part of the progressive wave outputted from the first directional coupler, a first High measurement value and a first Low measurement value respectively indicating a High level and a Low level of a power of the progressive wave in the output unit. The microwave generator is configured to alternately generate a microwave of a first waveform and a microwave of a second waveform in synchronization with switching of the High level and the Low level of the power. The microwave of the first waveform has a median frequency, a bandwidth and a carrier pitch according to a set frequency, a set bandwidth and a set carrier pitch instructed from the controller, respectively. The microwave of the second waveform has a single frequency peak at a median frequency according to the set frequency instructed from the controller. The measurement device averages, between the first High measurement value and the first Low measurement value, the measurement value corresponding to the microwave of the first waveform with a moving average time equal to or larger than a reciprocal of the set carrier pitch and a preset sampling number. The measurement device averages, between the first High measurement value and the first Low measurement value, the measurement value corresponding to the microwave of the second waveform with a moving average time less than the reciprocal of the set carrier pitch and a preset sampling number. The microwave generator controls the power of the High level of the pulse-modulated microwave based on the averaged first High measurement value and the set power of High level. The microwave generator controls the power of the Low level of the pulse-modulated microwave based on the averaged first Low measurement value and the set power of Low level.

In this microwave output device, the microwave of the first waveform having the bandwidth and the microwave of the second waveform having the single frequency peak are alternately outputted in synchronization with the High level and the Low level of the power. The microwave of the first waveform having the bandwidth has a waveform which goes up and down with a lapse of time, and the microwave of the second waveform has a waveform which does not go up and down largely with the lapse of time. Accordingly, as compared to a case where the microwave having the bandwidth is pulse-modulated, this microwave output device is capable of allowing a boundary between the High level power period and the Low level power period to be easily recognized. Thus, this microwave output device is capable of outputting the microwave in which the pulse frequency and the duty ratio of the pulse-modulated microwave can be easily monitored. Further, in this microwave output device, in performing the averaging processing upon the power of the microwave of the first waveform, the measurement value corresponding to the microwave of the first waveform is averaged with the moving average time equal to or larger than the reciprocal of the set carrier pitch. Accordingly, the microwave output device is capable of controlling the power of the microwave of the first waveform having the bandwidth appropriately. Further, in performing the averaging processing upon the power of the microwave having the second waveform, the measurement value corresponding to the microwave of the second waveform is averaged with the moving average time less than the reciprocal of the set carrier pitch. Therefore, in this microwave output device, the power control can be performed at a high speed, as compared to a power control in case of pulse-modulating the microwave having the bandwidth.

The microwave generator may further include a second directional coupler configured to output a part of a reflection wave returned to the output unit. Here, the measurement device further determines, based on the part of the reflection wave outputted from the second directional coupler, a second High measurement value and a second Low measurement value respectively indicating a High level and a Low level of a power of the reflection wave in the output unit. The measurement device averages, between the second High measurement value and the second Low measurement value, the measurement value corresponding to the microwave of the first waveform with a moving average time equal to or larger than the reciprocal of the set carrier pitch and a preset sampling number. The measurement device averages, between the second High measurement value and the second Low measurement value, the measurement value corresponding to the microwave of the second waveform with a moving average time less than the reciprocal of the set carrier pitch and a preset sampling number. The microwave generator controls the power of High level of the pulse-modulated microwave based on the averaged first High measurement value, the averaged second High measurement value and the set power of High level. The microwave generator controls the power of Low level of the pulse-modulated microwave based on the averaged first Low measurement value, the averaged second Low measurement value and the set power of Low level.

In this case, in the microwave output device, the High level power of the pulse-modulated microwave is controlled based on the averaged first High measurement value, the averaged second High measurement value, and the set High level power. Furthermore, the Low level power of the pulse-modulated microwave is controlled based on the averaged first Low measurement value, the averaged second Low measurement value, and the set Low level power. In this way, the microwave output device is capable of controlling the High level power and the Low level power by using the measurement values of the progressive wave and the reflection wave.

The microwave generator controls the microwave such that a value obtained by subtracting the averaged second High measurement value from the averaged first High measurement value approaches the set power of High level. The microwave generator controls the microwave such that a value obtained by subtracting the averaged second Low measurement value from the averaged first Low measurement value approaches the set power of Low level. In this case, the microwave output device is capable of controlling a load control over each of the first microwave and the second microwave which are pulse-modulated.

In another exemplary embodiment, a plasma processing apparatus is provided. The plasma processing apparatus includes a chamber main body and a microwave output device. The microwave output device is configured to output a microwave for exciting a gas supplied into the chamber main body. This microwave output device is one of the microwave output devices according to the above-described exemplary embodiments.

Hereinafter, the various exemplary embodiments will be described with reference to the accompanying drawings. In the various drawings, same or corresponding parts will be assigned same reference numerals.

[Plasma Processing Apparatus]

FIG. 1 is a diagram illustrating an example of a plasma processing apparatus according to an exemplary embodiment. As depicted in FIG. 1, the plasma processing apparatus 1 includes a chamber main body 12 and a microwave output device 16. The plasma processing apparatus 1 may be further equipped with a stage 14, an antenna 18 and a dielectric window 20.

The chamber main body 12 provides a processing space S therein. The chamber main body 12 has a sidewall 12a and a bottom 12b. The sidewall 12a is formed to have a substantially cylindrical shape. A central axis of this sidewall 12a substantially coincides with an axis Z extending in a vertical direction. The bottom 12b is provided at a lower end of the sidewall 12a. An exhaust hole 12h for a gas exhaust is provided at the bottom 12b. Further, an upper end of the sidewall 12a is opened.

The dielectric window 20 is provided on the upper end of the sidewall 12a. This dielectric window 20 has a bottom surface 20a facing the processing space S. The dielectric window 20 closes an opening at the upper end of the sidewall 12a. An O-ring 19 is disposed between the dielectric window 20 and the upper end of the sidewall 12a. Due to the presence of the O-ring 19, the chamber main body 12 is hermetically sealed more securely.

The stage 14 is accommodated in the processing space S. The stage 14 is disposed to face the dielectric window 20 in the vertical direction. Further, the stage 14 is disposed such that the processing space S exists between this stage 14 and the dielectric window 20. The stage 14 is configured to support a processing target object WP (for example, a wafer) placed thereon.

In one exemplary embodiment, the stage 14 includes a base 14a and an electrostatic chuck 14c. The base 14a has a substantially disk shape, and is made of a conductive material such as aluminum. A central axis of the base 14a substantially coincides with the axis Z. This base 14a is supported by a cylindrical supporting member 48. The cylindrical supporting member 48 is made of an insulating material and extended vertically upwards from the bottom 12b. A conductive cylindrical supporting member 50 is provided around the cylindrical supporting member 48. The cylindrical supporting member 50 is extended vertically upwards from the bottom 12b of the chamber main body 12 along a side surface of the cylindrical supporting member 48. An annular exhaust path 51 is formed between the cylindrical supporting member 50 and the sidewall 12a.

A baffle plate 51 is provided in an upper portion of the exhaust path 51. The baffle plate 52 has a ring shape. A multiple number of through holes are formed in this baffle plate 52 in a thickness direction thereof. The aforementioned exhaust hole 12h is formed under the baffle plate 52. An exhaust device 56 is connected to the exhaust hole 12h through an exhaust line 54. The exhaust device 56 has an automatic pressure control valve (APC) and a vacuum pump such as a turbo molecular pump. The processing space S can be decompressed to a required vacuum level by this exhaust device 56.

The base 14a also serves as a high frequency electrode. The base 14a is electrically connected with a high frequency power supply 58 for high frequency bias via a power feed rod 62 and a matching unit 60. The high frequency power supply 58 is configured to output a high frequency power having a constant frequency, e.g., 13.56 MHz, suitable for controlling energy of ions to be incident into the processing target object WP at a set power level.

Further, the high frequency power supply 58 may have a pulse generator and apply the high frequency power (RF power) to the base 14a while pulse-modulating the high frequency power. In this case, the high frequency power supply 58 pulse-modulates the high frequency power such that a High-level power and a Low-level power are repeated periodically. The high frequency power supply 58 adjusts the pulse based on a synchronization signal PSS-R generated by the pulse generator. The synchronization signal PSS-R is a signal which determines a cycle and a duty ratio of the high frequency power. As an example of settings for the pulse modulation, a pulse frequency may be in a range from 10 Hz to 50 kHz, and a pulse duty ratio (a ratio of a High-level power period to the pulse cycle) may be in a range from 10% to 90%.

The matching unit 60 accommodates therein a matching device configured to match an impedance of the high frequency power supply 58 and an impedance at a load side such as, mainly, an electrode, plasma or the chamber main body 12. This matching device includes a blocking capacitor for self-bias generation. The matching unit 60 is operated to carry out the matching based on the synchronization signal PSS-R when the high frequency power is pulse-modulated.

The electrostatic chuck 14c is provided on a top surface of the base 14a. The electrostatic chuck 14c is configured to hold the processing target object WP by an electrostatic attracting force. The electrostatic chuck 14c includes an electrode 14d, an insulating film 14e and an insulating film 14f, and has a substantially disk shape. A central axis of the electrostatic chuck 14c substantially coincides with the axis Z. The electrode 14d of this electrostatic chuck 14c is made of a conductive film and embedded between the insulating films 14e and 14f. The electrode 14d is electrically connected with a DC power supply 64 via a switch 66 and a coating line 68. The electrostatic chuck 14c is capable of attracting and holding the processing target object WP by a Coulomb force generated by a DC voltage applied from the DC power supply 64. Further, a focus ring 14b is disposed on the base 14a. The focus ring 14b is configured to surround the processing target object WP and the electrostatic chuck 14c.

A coolant path 14g is provided within the base 14a. The coolant path 14g is extended around, for example, the axis Z. A coolant from a chiller unit is supplied into this coolant path 14g through a pipeline 70. The coolant supplied into the coolant path 14g is returned back into the chiller unit through a pipeline 72. As a temperature of the coolant is controlled by the chiller unit, a temperature of the electrostatic chuck 14c, and, ultimately, a temperature of the processing target object WP are controlled.

Further, a gas supply line 74 is formed in the stage 14. This gas supply line 74 is provided to supply a heat transfer gas, for example, a He gas into a gap between a top surface of the electrostatic chuck 14c and a rear surface of the processing target object WP.

The microwave output device 16 outputs a microwave for exciting a processing gas supplied into the chamber main body 12. The microwave output device 16 is configured to vary (adjust) a frequency, a power and a bandwidth of the microwave. For example, by setting the bandwidth of the microwave to be approximately zero (0), the microwave output unit 16 is capable of generating a microwave having a single frequency. Further, the microwave output device 16 is capable of generating a microwave having a bandwidth including multiple frequency components. Powers of these multiple frequency components may be same, or only a median frequency component within the frequency band may have a power larger than a power of the other frequency components. As an example, the microwave output device 16 is capable of adjusting the power of the microwave within a range from 0 W to 5000 W. As an example, the microwave output device 16 is capable of adjusting the frequency or the median frequency of the microwave within a range from 2400 MHz to 2500 MHz. As an example, the microwave output device 16 is capable of adjusting the bandwidth of the microwave within a range from 0 MHz to 100 MHz. Furthermore, the microwave output device 16 is capable of adjusting a pitch (carrier pitch) of frequencies of the multiple frequency components of the microwave within the frequency band within a range from 0 kHz to 25 kHz.

The microwave output device 16 may have a pulse generator, and is configured to pulse-modulate and output the power of the microwave. In this case, the microwave output device 16 pulse-modulates the power of the microwave such that a High-level power and a Low-level power are repeated periodically. The microwave output device 16 performs this pulse modulation based on a synchronization signal PSS-M generated by the pulse generator. The synchronization signal PSS-M is a signal which determines a cycle and a duty ratio of the power of the microwave. As an example of settings for the pulse modulation, a pulse frequency may be in a range from 1 Hz to 50 kHz, and a pulse duty ratio (a ratio of a High-level power period to the pulse cycle) is in a range from 10% to 90%. The microwave output device 16 may pulse-modulate the power of the microwave so that the power of the microwave is synchronized with the high frequency power outputted and pulse-modulated by the high frequency power supply 58.

The plasma processing apparatus 1 is further equipped with a waveguide 21, a tuner 26, a mode converter 27 and a coaxial waveguide 28. An output of the microwave output device 16 is connected to one end of the waveguide 21. The other end of the waveguide 21 is connected to the mode converter 27. The waveguide 21 is, for example, a rectangular waveguide. The waveguide 21 is provided with the tuner 26. The tuner 26 has stubs 26a, 26b and 26c. Each of the stubs 26a to 26c is configured such that a protruding amount thereof into an internal space of the waveguide 21 is adjustable. The tuber 26 matches the impedance of the microwave output device 16 and an impedance at a load side, for example, the chamber main body 12 by controlling protruding positions of the stubs 26a, 26b and 26c with respect to a reference position.

The mode converter 27 is configured to covert a mode of the microwave from the waveguide 21 and supply the mode-converted microwave to the coaxial waveguide 28. The coaxial waveguide 28 includes an external conductor 28a and an internal conductor 28b. The external conductor 28a has a substantially cylindrical shape, and a central axis thereof substantially coincides with the axis Z. The internal conductor 28b has a substantially cylindrical shape, and is elongated within the external conductor 28a. A central axis of the internal conductor 28b substantially coincides with the axis Z. This coaxial waveguide 28 transmits the microwave from the mode converter 27 to the antenna 18.

The antenna 18 is provided on a surface 20b of the dielectric window 20 opposite from the bottom surface 20a thereof. The antenna 18 includes a slot plate 30, a dielectric plate 32 and a cooling jacket 34.

The slot plate 30 is provided on the surface 20b of the dielectric window 20. The slot plate 30 is made of a metal having conductivity and has a substantially disk shape. A central axis of the slot plate 30 substantially coincides with the axis Z. The slot plate 30 has multiple slot holes 30a. As an example, these multiple slots holes 30a form a multiple number of slot pairs. Each of these slot pairs includes two slot holes 30a elongated in intersecting directions. The multiple number of slot pairs are arranged along one or more concentric circles around the axis Z. Further, formed at a central portion of the slot plate 30 is a through hole 30d through which a conduit 36 to be described later can be inserted.

The dielectric plate 32 is provided on the slot plate 30. The dielectric plate 32 is made of a dielectric material such as quartz, and has a substantially disk shape. A central axis of this dielectric plate 32 substantially coincides with the axis Z. The cooling jacket 34 is provided on the dielectric plate 32. The dielectric plate 32 is provided between the cooling jacket 34 and the slot plate 30.

A surface of the cooling jacket 34 has conductivity. A path 34a is provided within the cooling jacket 34. A coolant is supplied into this path 34a. A lower end of the external conductor 28a is electrically connected to an upper surface of the cooling jacket 34. Further, a lower end of the internal conductor 28b is electrically connected to the slot plate 30 through holes formed at central portions of the cooling jacket 34 and the dielectric plate 32.

The microwave from the coaxial waveguide 28 is propagated within the dielectric plate 32 and supplied to the dielectric window 20 through the slot holes 30a of the slot plate 30. The microwave supplied to the dielectric window 20 is introduced into the processing space S.

The conduit 36 passes through an inner hole of the internal conductor 28b of the coaxial waveguide 28. As stated above, the through hole 30d is formed at the central portion of the slot plate 30, and the conduit 36 is inserted in this through hole 30*d*. The conduit 36 is extended through the inner hole of the internal conductor 28*b* and connected to a gas supply system 38.

The gas supply system 38 is configured to supply the processing gas for processing the processing target object WP into the conduit 36. The gas supply system 38 may include a gas source 38*a*, a valve 38*b* and a flow rate controller 38*c*. The gas source 38*a* is a source of the processing gas. The valve 38*b* switches a supply and a stop of the supply of the processing gas from the gas source 38*a*. The flow rate controller 38*c* may be, by way of non-limiting example, a mass flow controller, and adjusts a flow rate of the processing gas from the gas source 38*a*.

The plasma processing apparatus 1 may be further equipped with an injector 41. The injector 41 is configured to supply the processing gas from conduit 36 into a through hole 20*h* of the dielectric window 20. The processing gas supplied into the through hole 20*h* of the dielectric window 20 is then introduced into the processing space S. This processing gas is excited by the microwave introduced into the processing space S from the dielectric window 20. As a result, plasma is formed within the processing space S, and the processing target object WP is processed by active species such as ions and/or radicals from the plasma.

The plasma processing apparatus 1 is further equipped with a controller 100. The controller 100 is configured to control the individual components of the plasma processing apparatus 1 in overall. The controller 100 may be equipped with a processor such as a CPU, a user interface, and a storage.

The processor controls the individual components such as the microwave output device 16, the stage 14, the gas supply system 38, the exhaust device 56, and so forth in an overall manner by executing programs and processing recipe stored in the storage.

The user interface includes a keyboard or a touch panel through which a process manager inputs a command to manage the plasma processing apparatus 1; a display configured to visually display an operational status of the plasma processing apparatus 1; and so forth.

The storage stores therein control programs (software) for implementing various processings performed in the plasma processing apparatus 1 under the control of the processor; processing recipes including processing condition data or the like; and so forth. When necessary, for example, in response to an instruction from the user interface, the processor retrieves various control programs from the storage and executes them. Under this control of the processor, a required processing is performed in the plasma processing apparatus 1.

[Example of Microwave]

Figure 2:
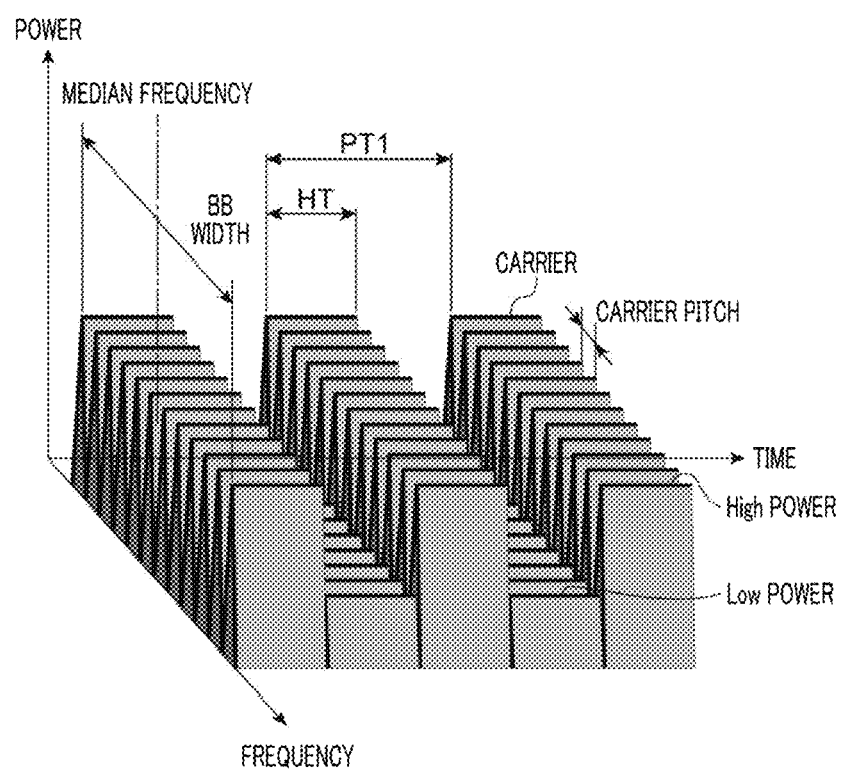
FIG. 2 illustrates an example of a microwave a power which is pulse-modulated.

The power of the microwave outputted from the microwave output device 16 has a waveform modulated in a pulse shape such that a power of high level (High-level power) and a power of low level (Low-level power) are repeated. FIG. 2 illustrates an example of a microwave in which a power thereof is pulse-modulated so that both the High-level power and the Low-level power have bandwidths. As depicted in FIG. 2, the microwave having the bandwidth has a pulse frequency, a duty ratio, a High-level power and a Low-level power according to set values instructed from the controller 100. The set values instructed from the controller 100 include a set pulse frequency, a set duty ratio, a set power of high level (set High-level power) and a set power of low level (set Low-level power). The Low-level power is lower than the High-level power.

The Low-level power may be equal to or larger than the lowest power level required to maintain a plasma formation state. As an example, the set Low-level power may be equal to or larger than 500 W. Further, if the set Low-level power is 0 W, the power of the microwave can be controlled ON/OFF. If the set Low-level power exceeds 0 W and is less than 500 W, the power of the microwave is controlled to be High/Low to the extent that plasma excitation does not occur at the Low-level power.

When the power of the microwave is of the High-level, the microwave (an example of a microwave having a first waveform) has a median frequency, a bandwidth and a carrier pitch according to set values instructed from the controller 100. The set values include a set frequency, a set bandwidth and a set carrier pitch. A single waveform of the microwave having a bandwidth is referred to as a carrier. The carrier pitch is an interval of carriers, and a reciprocal of the carrier pitch is equivalent to a cycle of the microwave having the bandwidth. When the power of the microwave is of the Low-level, the microwave (an example of a microwave having a second waveform) has a single frequency peak at the median frequency according to the set frequency instructed from the controller 100. Combinations of the microwave having the High-level/Low-level powers and the microwave having the single frequency peak are not limited to the aforementioned example. By way of example, the microwave having the High-level power may be a microwave having the single frequency peak, and the microwave having the Low-level power may be the microwave having the bandwidth.

[Configuration Example of Microwave Output Device 16]

Figure 3:
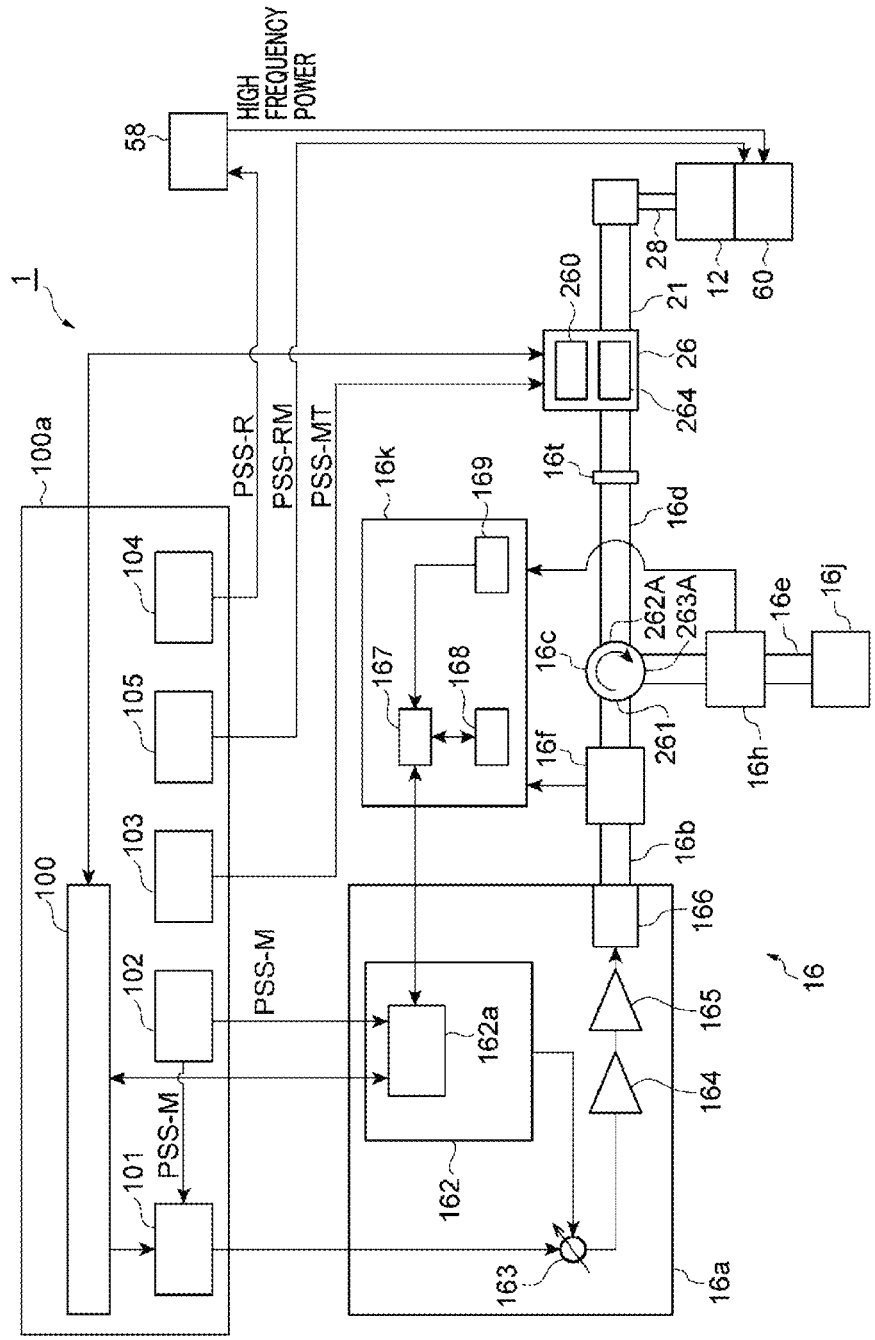
FIG. 3 is a diagram illustrating an example of a microwave output device.

FIG. 3 is a diagram illustrating an example of the microwave output device. As depicted in FIG. 3, the microwave output device 16 is connected to an operation device 100*a*. The operation device 100*a* includes the controller 100, a waveform generator 101, a first pulse generator 102, a second pulse generator 103, a third pulse generator 104 and a fourth pulse generator 105.

The waveform generator 101 is configured to generate a waveform of a microwave. The waveform generator 101 is capable of generating two kinds of waveforms of the microwave. As a first waveform, the waveform generator 101 generates a waveform of the microwave having a median frequency, a bandwidth and a carrier pitch according to set values designated by the controller 100. The set values include a set frequency, a set bandwidth and a set carrier pitch. As a second waveform, the waveform generator 101 generates a waveform of the microwave having a single frequency peak at the median frequency according to the set frequency instructed from the controller 100.

The first pulse generator 102 is configured to generate a synchronization signal. The synchronization signal is used to decide timings for the generation of the two kinds of waveforms of the microwave and, also, to pulse-modulate the power of the microwave in the microwave output device 16. The first pulse generator 102 generates the synchronization signal PSS-M based on a set pulse frequency and a set duty ratio of the power of the microwave in a setting profile set by the controller 100. The first pulse generator 102 outputs the synchronization signal PSS-M to the waveform generator 101 and the microwave output device 16.

The waveform generator 101 outputs the waveform of the microwave having the bandwidth and the waveform of the microwave having the single frequency peak alternately. The waveform generator 101 is operated based on the synchronization signal PSS-M outputted from the first pulse generator 102. The waveform generator 101 determines the timing for the generation of the waveform of the microwave having the bandwidth and the timing for the generation of the waveform of the microwave having the single frequency peak. The waveform generator 101 outputs the waveform of the microwave to the microwave output device 16.

The second pulse generator 103 generates a synchronization signal for use in performing, in the tuner 26, impedance matching on the microwave whose power is pulse-modulated. Like the first pulse generator 102, the second pulse generator 103 generates a synchronization signal PSS-MT based on the set pulse frequency and the set duty ratio of the power of the microwave in the setting profile set by the controller 100. The synchronization signal PSS-MT has the same pulse frequency and the same duty ratio as the synchronization signal PSS-M. The second pulse generator 103 outputs the synchronization signal PSS-MT to the tuner 26.

The third pulse generator 104 generates a synchronization signal for use in pulse-modulating the high frequency power in the high frequency power supply 58. The third pulse generator 104 generates a synchronization signal PSS-R based on a set pulse frequency and a set duty ratio of the high frequency power in the setting profile set by the controller 100. The third pulse generator 104 outputs the synchronization signal PSS-R to the high frequency power supply 58.

The fourth pulse generator 105 generates a synchronization signal for use in performing, in the matching unit 60, impedance matching upon the high frequency power whose power is pulse-modulated. Like the third pulse generator 104, the fourth pulse generator 105 generates a synchronization signal PSS-RM based on the set pulse frequency and the set duty ratio of the high frequency power in the setting profile set by the controller 100. The synchronization signal PSS-RM has the same pulse frequency and the same duty ratio as the synchronization signal PSS-R. The fourth pulse generator 105 outputs the synchronization signal PSS-RM to the matching unit 60.

The first pulse generator 102 may generate the synchronization signal PSS-M synchronized with the synchronization signal PSS-R. In this case, since the pulse modulation of the power of the microwave and the pulse modulation of the high frequency power can be synchronized, stable plasma formation is enabled.

The microwave output device 16 pulse-modulates the waveform of the microwave generated by the waveform generator 101 according to the set values of the controller 100, and outputs the microwave having this pulse-modulated waveform. The microwave output device 16 includes a microwave generator 16a, a waveguide 16b, a circulator 16c, a waveguide 16d, a waveguide 16e, a first directional coupler 16f, a second directional coupler 16h, a measurement device 16k (an example of a measuring unit) and a dummy load 16j.

The microwave generator 16a generates a microwave a power of which is pulse-modulated such that the microwave has a pulse frequency, a duty ratio, a High-level power and a Low-level power according to set values instructed from the controller 100. The set values include a set pulse frequency, a set duty ratio, a set High-level power and a set Low-level power.

The microwave generator 16a is equipped with a power controller 162, an attenuator 163, an amplifier 164, an amplifier 165 and a mode converter 166.

The waveform generator 101 is connected to the attenuator 163. As an example, the attenuator 163 is a device capable of varying an attenuation amount (attenuation rate) by adjusting an application voltage value. The attenuator 163 is connected with the power controller 162. The power controller 162 controls the attenuation rate (attenuation amount) of the microwave in the attenuator 163 by using the application voltage value. The power controller 162 controls the attenuation rate (attenuation amount) of the microwave in the attenuator 163 such that the microwave outputted by the waveform generator 101 becomes a microwave having a power according to a set value instructed from the controller 100.

The power controller 162 has, as an example, a control unit 162a. The control unit 162a may be a processor. The controller 162a acquires the setting profile from the controller 100. The control unit 162a acquires the synchronization signal PSS-M from the first pulse generator 102. The controller 162a determines the attenuation rate (attenuation amount) of the microwave based on the synchronization signal PSS-M and the setting profile set by the controller 100.

An output of the attenuator 163 is connected to the mode converter 166 via the amplifier 164 and the amplifier 165. The amplifiers 164 and 165 amplify the microwave at set amplification factors. The mode converter 166 converts a propagation mode of the microwave outputted from the amplifier 165 into TE01 from TEM. This microwave generated by the mode conversion in the mode converter 166 is outputted as an output microwave of the microwave generator 16a.

An output of the microwave generator 16a is connected to one end of the waveguide 16b. The other end of the waveguide 16b is connected to a first port 261 of the circulator 16c. The circulator 16c has the first port 261, a second port 262A, and a third port 263A. The circulator 16c is configured to output, from the second port 262A, the microwave inputted to the first port 261, and output, from the third port 263A, the microwave inputted to the second port 262A. The second port 262A of the circulator 16c is connected with one end of the waveguide 16d. The other end of the waveguide 16d is configured as an output unit 16t of the microwave output device 16.

The third port 263A of the circulator 16c is connected with one end of the waveguide 16e. The other end of the waveguide 16e is connected to the dummy load 16j. The dummy load 16j receives the microwave propagating in the waveguide 16e and absorbs this microwave. By way of example, the dummy load 16j converts the microwave to heat.

The first directional coupler 16f is provided between the one end and the other end of the waveguide 16b. The first directional coupler 16f is configured to split a part of the microwave propagated to the output unit 16t after being outputted from the microwave generator 16a (i.e., a progressive wave), and outputs the part of this progressive wave.

The second directional coupler 16h is provided between the one end and the other end of the waveguide 16e. The second directional coupler 16h is configured to split, for the microwave returned to the output unit 16t (that is, a reflection wave), a part of the reflection wave sent to the third port 263A of the circulator 16c, and outputs the part of this reflection wave.

The measurement device 16k is a device configured to measure the microwave within the waveguide. The measurement device 16k includes a measurement controller 167, a first detector 168 and a second detector 169.

The first detector 168 detects a measurement value according to a power of the progressive wave of the microwave within the waveguide. The first detector 168 receives the progressive wave outputted from the first directional coupler 16f. The second detector 169 detects a measurement value according to a power of the reflection wave of the microwave within the waveguide. The second detector 169 receives the reflection wave outputted from the second directional coupler 16h.

The measurement controller 167 determines, based on the part of the progressive wave acquired by the first detector 168, a first High measurement value (pfH) and a first Low measurement value (pfL) respectively indicating a High level and a Low level of the power of the progressive wave in the output unit 16t. The measurement controller 167 determines, based on the part of the reflection wave acquired by the second detector 169, a second High measurement value prH and a second Low measurement value prL respectively indicating a High level and a Low level of the power of the reflection wave in the output unit 16t. An example of the measurement value may be a detection voltage.

The measurement controller 167 acquires a frequency and a duty ratio of the power of the progressive wave based on the measurement values obtained by the first detector 168.

The measurement device 16k is connected to the power controller 162. The measurement device 16k outputs the measurement values to the power controller 162. The power controller 162 controls the attenuator 163 such that a difference between the measurement values of the progressive wave and the reflection wave, that is, a load power (effective power) coincides with a set power designated by the controller 100 (power feedback control).

The tuner 26 includes a tuner controller 260 and a tuner detector 264. Based on a signal of the controller 100 and a detection result of the tuner detector 264, the tuner controller 260 adjusts the protruding positions of the stubs 26a to 26c to match an impedance of the microwave output device 16 and an impedance of the antenna 18. As an example, the tuner detector 264 may be a 3-probe detector, and has three probes to which diodes are attached. The tuner controller 260 operates the stubs 26a to 26c by a non-illustrated driver circuit and a non-illustrated actuator.

The tuner controller 260 acquires the synchronization signal PSS-MT for the microwave power generated by the second pulse generator 103. The tuner controller 260 operates the stubs 26a to 26c based on the synchronization signal. The high frequency power supply 58 acquires the synchronization signal PSS-R for the high frequency power generated by the third pulse generator 104. The high frequency power supply 58 pulse-modulates the high frequency power based on the synchronization signal PSS-R. The matching unit 60 acquires the synchronization signal PSS-RM for the high frequency power generated by the fourth pulse generator 105. The matching unit 60 performs, based on this synchronization signal PSS-RM, the matching of the pulse-modulated high frequency power.

[Details of Pulse Generator]

Figure 4:
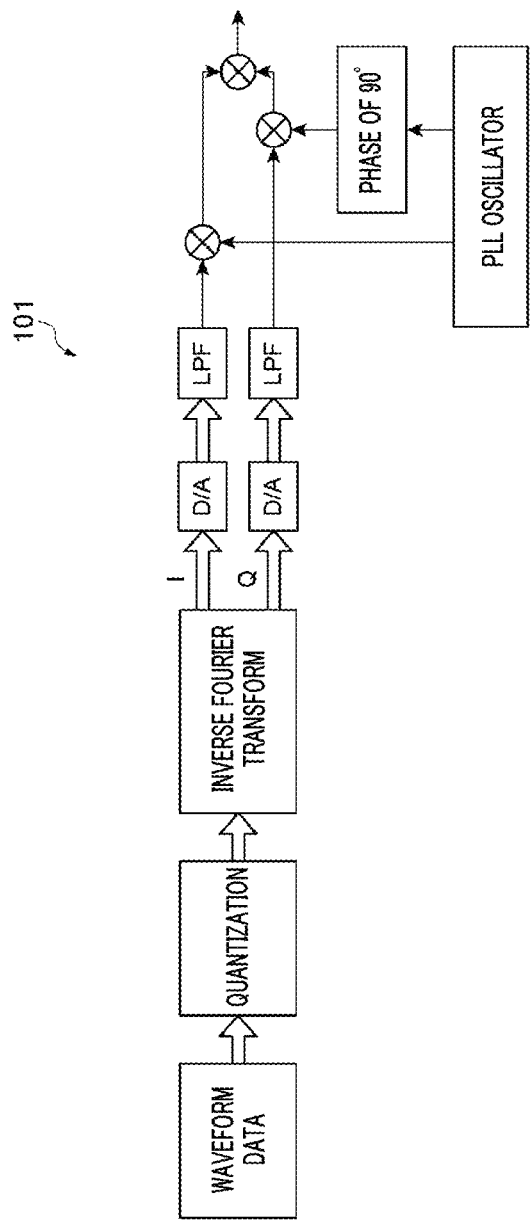
FIG. 4 is a diagram illustrating an example of a principle of generation of the microwave in a waveform generator.

FIG. 4 is a diagram illustrating a principle of the generation of the microwave in the waveform generator. As depicted in FIG. 4, the waveform generator 101 includes, for example, a PLL (Phase Locked Loop) oscillator configured to oscillate a microwave having a phase synchronized with a reference frequency; and an IQ digital modulator connected to the PLL oscillator. The waveform generator 101 sets a frequency of the microwave oscillated from the PLL oscillator to the set frequency designated by the controller 100. Further, the waveform generator 101 modulates the microwave from the PLL oscillator and a microwave having a phase difference of 90° from the microwave from the PLL oscillator by using the IQ digital modulator. Accordingly, the waveform generator 101 generates the microwave having the multiple frequency components within a band, or the microwave having the single frequency.

The waveform generator 101 is configured to generate continuous signals by performing, for example, inverse discrete Fourier transform upon n-number of complex data symbols to thereby generate the microwave having the multiple frequency components. This method of generating such a signal may be the same as an OFDMA (Orthogonal Frequency-Division Multiple Access) modulation method used in digital TV broadcasting or the like.

As an example, the waveform generator 101 has waveform data represented by a row of previously digitalized codes. The waveform generator 101 quantizes the waveform data, and generates I data and Q data by applying the inverse Fourier transform to the quantized data. Further, the waveform generator 101 obtains two analog signals by respectively applying D/A (Digital/Analog) conversion to the I data and the Q data. The waveform generator 101 inputs these analog signals to a LPF (Low Pass Filter) which allows only a low frequency component to pass therethrough. The waveform generator 101 mixes the two analog signals outputted from the LPF with the microwave oscillated from the PLL oscillator and the microwave having the phase difference of 90° from the microwave oscillated from the PLL oscillator, respectively. Then, the waveform generator 101 combines the microwaves generated by the mixing. Through these operations, the waveform generator 101 generates the microwave having the single frequency component or the multiple frequency components.

[Example of Waveform Generated by Waveform Generator]

Figure 5A:
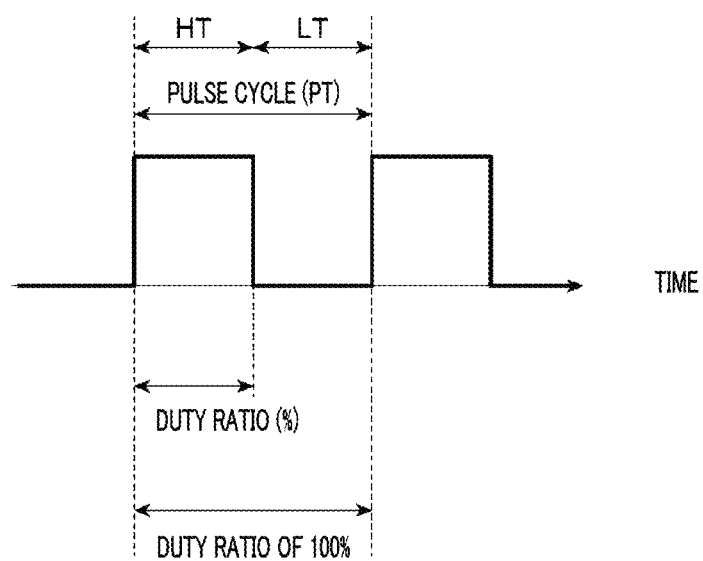
FIG. 5A and FIG. 5B illustrate examples of a synchronization signal and a waveform of the microwave.
Figure 5B:
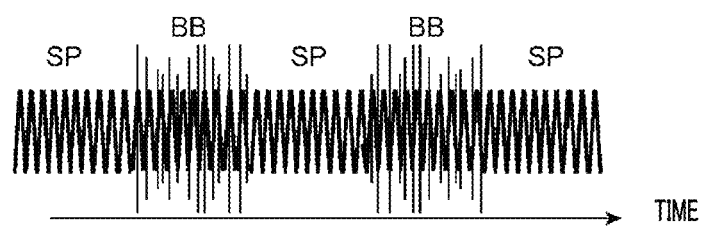

The waveform generator 101 may generate the microwave having the single frequency component and the microwave having the multiple frequency components alternately based on the synchronization signal PSS-M. Hereinafter, examples of the synchronization signal and the waveform of the microwave generated by the waveform generator will be explained. FIG. 5A and FIG. 5B illustrate the examples of the synchronization signal and the waveform of the microwave. As depicted in FIG. 5A, the synchronization signal PSS-M is a pulse signal in which an ON state (High state) and an OFF state (Low state) appear alternately. A pulse cycle PT of the synchronization signal PSS-M is defined as an interval between timings when the High-level appears. A ratio of a High period HT to the pulse cycle PT is a duty ratio. The first pulse generator 102 generates the synchronization signal as shown in FIG. 5A based on a pulse frequency (1/PT) and a duty ratio (HT/PT×100[%]) designated by the controller 100.

The waveform generator 101 generates the waveform of the microwave having the broadband frequency during the High period HT, and generates the waveform of the microwave having the single frequency peak during a Low period LT. In FIG. 5B, the waveform of the microwave having the broadband frequency is marked as a BB (Broad Band) waveform (an example of the first waveform), the waveform of the microwave having the single frequency peak is marked as a SP (Single Peak) waveform (an example of the second waveform). The waveform generator 101 may reverse the timings for the generation of the BB waveform and the SP waveform. That is, the waveform generator 101 may generate the waveform of the microwave having the single frequency peak during the High period HT and generate the waveform of the microwave having the broadband frequency during the Low period LT.

[Example of Power Control Over Microwave]

Figure 6:
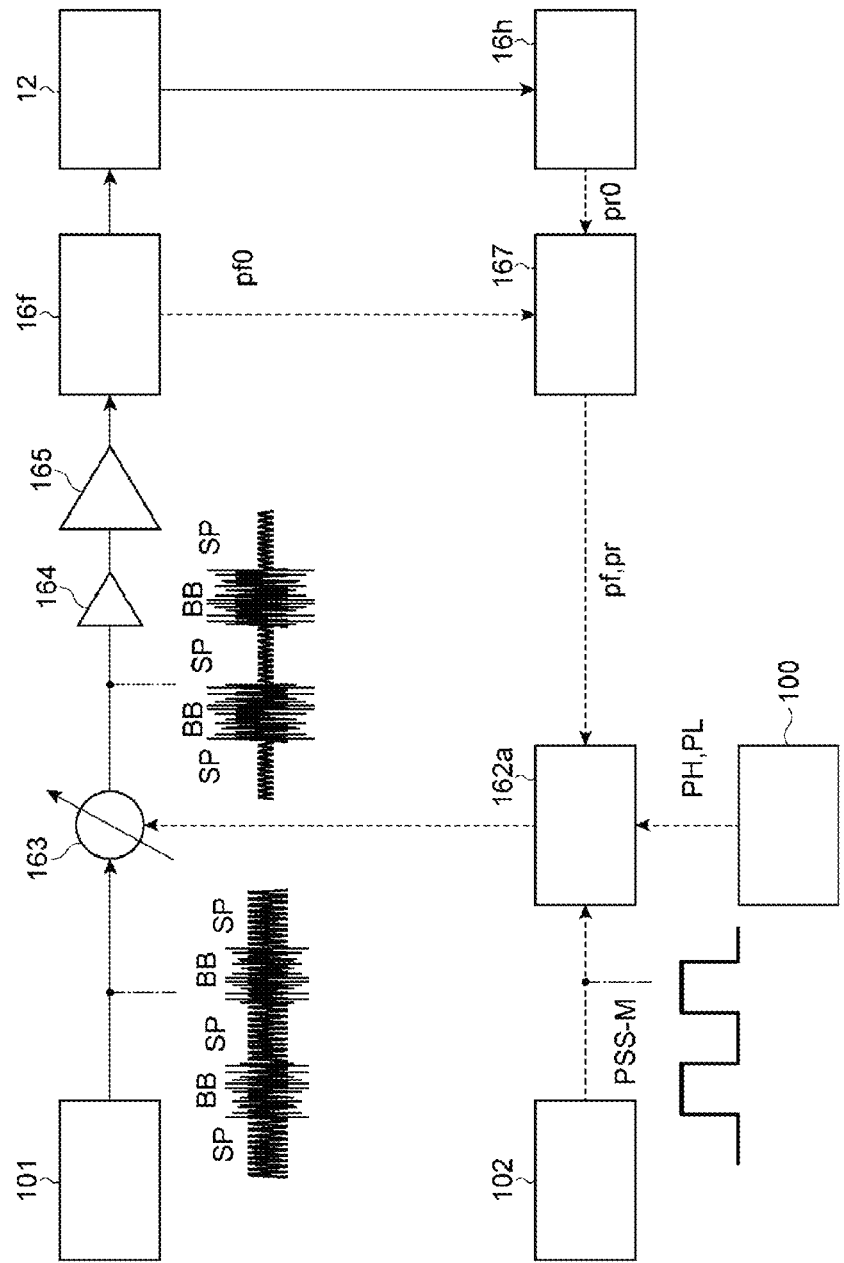
FIG. 6 is a diagram illustrating an example configuration for a control over the power of the microwave.

The waveform generated by the waveform generator is outputted with the power thereof modulated and amplified. FIG. 6 is a diagram illustrating an example configuration for a power control over the microwave. As shown in FIG. 6, the power control is carried out by the measurement controller 167 and the control unit 162*a*.

As depicted in FIG. 6, the waveform generator 101 outputs the waveform of the microwave where the SP waveform and the BB waveform appear alternately. The control unit 162*a* operates the attenuator 163 to thereby pulse-modulate the power of the microwave. The control unit 162*a* determines the High period and the Low period based on the synchronization signal PSS-M outputted from the first pulse generator 102. The control unit 162*a* operates the attenuator 163 such that the power of the microwave becomes a power PH having the set High level outputted from the controller 100 during the High period, whereas the power of the microwave becomes a power PL having the set Low level during the Low period. Accordingly, a microwave in which only the SP waveform portion is attenuated is obtained. This microwave is amplified by the amplifiers 164 and 165 to be sent to the chamber main body 12.

The measurement controller 167 acquires a measurement value pf0 of the power of the progressive wave from the first directional coupler 16*f* and a measurement value pr0 of the power of the reflection wave from the second directional coupler 16*h*. The measurement controller 167 performs the sampling of the measurement values and outputs the sampled measurement values to the control unit 162*a*. The control unit 162*a* performs the power feedback control such that a difference between the measurement value pf of the power of the progressive wave and the measurement value pr of the power of the reflection wave becomes a set value. Through this feedback loop, the set values designed by the controller 100 are obtained.

In case that the power of the microwave is pulse-modulated, the High-level power and the Low-level power need to be feedback-controlled individually. That is, the measurement controller 167 measures a first High measurement value pfH, a first Low measurement value pfL, a second High measurement value prH and a second Low measurement value prL, and outputs the measurement results to the control unit 162*a*. The control unit 162*a* switches the feedback control over the High-level lower and the feedback control over the Low-level power based on the synchronization signal PSS-M.

When the feedback control over the High-level power is performed, the control unit 162*a* controls the High-level power of the pulse-modulated microwave, based on the first High measurement value pfH, the second High measurement value prH and the set High-level power. Further, when the feedback control over the Low-level power is performed, the control unit 162*a* controls the Low-level power of the pulse-modulated microwave, based on the first Low measurement value pfL, the second Low measurement value prL and the set Low-level power.

To be more specific, in the feedback control over the High-level power, the control unit 162*a* controls the High-level power of the microwave outputted from the microwave output device 16. The control unit 162*a* controls the power to allow a difference between the first High measurement value pfH and the second High measurement value prH to approach the set High-level power designated by the controller 100. Further, in the feedback control over the Low-level power, the control unit 162*a* controls the Low-level power of the microwave outputted from the microwave output device 16. The control unit 162*a* controls the power to allow a difference between the first Low measurement value pfL and the second Low measurement value prL to approach the set Low-level power designated by the controller 100. As a result, a load power of the microwave supplied to a load coupled to the output unit 16*t* is allowed to be approximate to a set power.

[Detection Period]

Figure 7A:
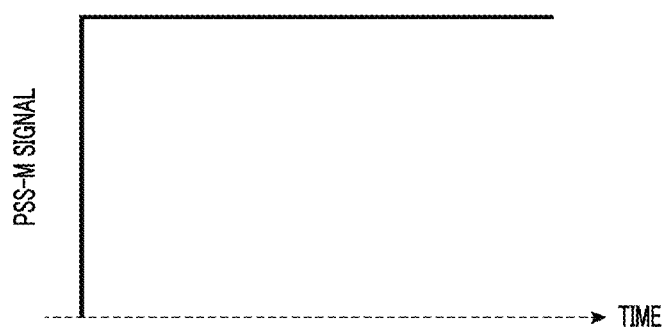
FIG. 7A and FIG. 7B illustrate examples of a synchronization signal and a power of a microwave when the power is not pulse-modulated.
Figure 7B:
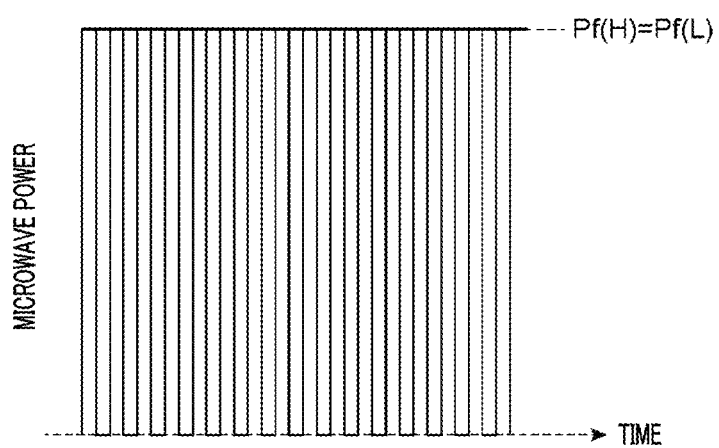

FIG. 7A and FIG. 7B illustrate an example of a synchronization signal and a power of a microwave when the power of the microwave is not modulated. FIG. 7A illustrates the synchronization signal PSS-M, and FIG. 7B shows the power of the progressive wave of the microwave. As shown in FIG. 7A and FIG. 7B, when the power of the microwave is not pulse-modulated, the synchronization signal PSS-M has a constant value. Further, since the power of the microwave is also constant, averaged measurement values PfH and PfL are same regardless of which period of moving average time is applied. Likewise, for the power of the reflection wave, averaged measurement values PrH and PrL are same.

In the power modulation, the power of the microwave is modulated periodically. For the reason, to acquire the High-level measurement value and the Low-level measurement value, the measurement needs to be performed based on the synchronization signal PSS-M. As definition data, a H detection mask time, a H detection period, a L detection mask time and a L detection period are stored in a storage (not shown) of the power controller 162.

Figure 8A:
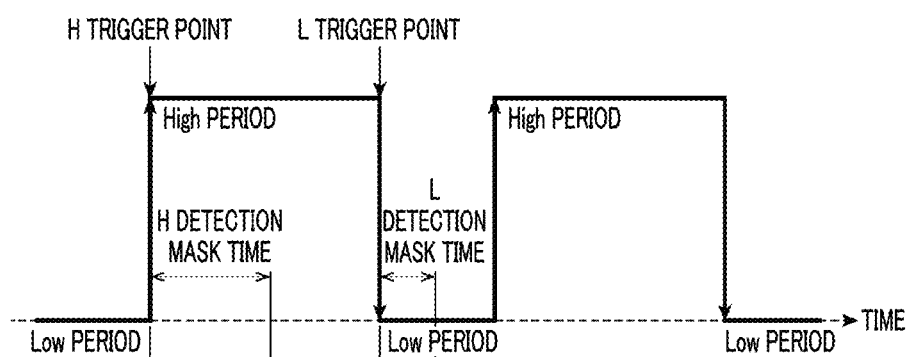
FIG. 8A and FIG. 8B are diagrams illustrating an example of a microwave detection period when a power modulation is performed.
Figure 8B:
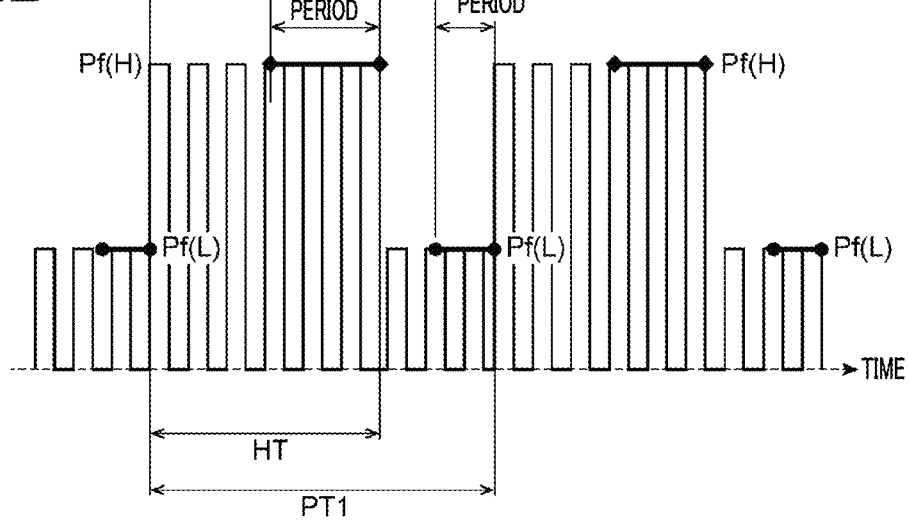

FIG. 8A and FIG. 8B illustrate a microwave detection period in the power modulation. FIG. 8A shows the synchronization signal PSS-M, and FIG. 8B shows the power of the progressive wave of the microwave. As depicted in FIG. 8A and FIG. 8B, an ON period of the synchronization signal PSS-M is referred to as a High period, and an OFF period thereof is referred to as a Low period. A moment when the pulse of the synchronization signal PSS-M rises is referred to as an H trigger point (a timing when the power reaches the High level), and a moment when the pulse of the synchronization signal PSS-M falls is referred to as an L trigger point (a timing when the power reaches the Low level).

The H detection mask time refers to a time taken until a preset time elapses from the H trigger point. During the H detection mask time, acquisition of data is prohibited. The H detection mask time is provided to avoid the acquisition of data in a period during which the power of the microwave is instable. The H detection period is a period ranging from an end of the H detection mask to the L trigger point. The H detection period is a period when the High-level measurement value pfH of the progressive wave is acquired.

The L detection mask time refers to a time taken until a preset time elapses from the L tripper point. During the L detection mask time, acquisition of data is prohibited. The L detection mask time is provided to avoid the acquisition of data in a period during which the power of the microwave is instable. The L detection period is a period ranging from an end of the L detection mask time to the H tripper point. The L detection period is a period when the Low-level measurement value pfL is acquired.

The averaged measurement values PfH and PfL are calculated based on the measurement values pfH and pfL detected in the H detection period and the L detection period, respectively. Further, the detection periods for the power of the reflection wave are set by the same method as used to set the detection periods for the power of the progressive wave.

FIG. 9A to FIG. 9D are diagrams illustrating an example of a detection voltage of the progressive wave of the microwave in the power modulation. FIG. 9A shows an example of a detection voltage pf obtained by the measurement device 16k. A horizontal axis of FIG. 9A represents time, and a vertical axis thereof indicates a voltage value. In the example shown in FIG. 9A, in a predetermined time period back in time from a current time, there are three High levels and four Low levels. FIG. 9B shows an example of a detection voltage pf obtained by the measurement device 16k with the H detection mask time and the L detection mask time, corresponding to FIG. 9A. A horizontal axis of FIG. 9B represents time, and a vertical axis thereof indicates a voltage value. As depicted in FIG. 9B, three H detection periods and four L detection periods are obtained. FIG. 9C shows a detection voltage pfH obtained by connecting the H detection periods shown in FIG. 9B in a time series on a memory. Here, m-number of H detection periods are connected. FIG. 9D shows a detection voltage pfL obtained by connecting the L detection periods shown in FIG. 9B in a time series on the memory. Here, n-number of L detection periods are connected. In this way, by connecting the detection periods on the memory, the measurement device 16k is capable of obtaining the temporally continuous progressive wave power.

FIG. 10A to FIG. 10D are diagrams illustrating an example of a detection voltage of the reflection wave of the microwave in the power modulation. FIG. 10A shows an example of a detection voltage pr obtained by the measurement device 16k. A horizontal axis of FIG. 10A represents time, and a vertical axis thereof indicates a voltage value. In the example shown in FIG. 10A, in a predetermined time period back in time from the current time, there are three High levels and four Low levels. FIG. 10B shows an example of a detection voltage pr obtained by the measurement device 16k with the H detection mask time and the L detection mask time, corresponding to FIG. 10A. A horizontal axis of FIG. 10B represents time, and a vertical axis thereof indicates a voltage value. As depicted in FIG. 10B, three H detection periods and four L detection periods are obtained. FIG. 10C shows a detection voltage prH obtained by connecting the H detection periods shown in FIG. 10B in a time series on the memory. Here, m-number of H detection periods are connected. FIG. 10D shows a detection voltage prL obtained by connecting the L detection periods shown in FIG. 10B in a time series on the memory. Here, n-number of L detection periods are connected. In this way, by connecting the detection periods on the memory, the measurement device 16k is capable of obtaining the temporally continuous reflection wave power.

[Example of Data Sampling of Measurement Controller]

Figure 11:
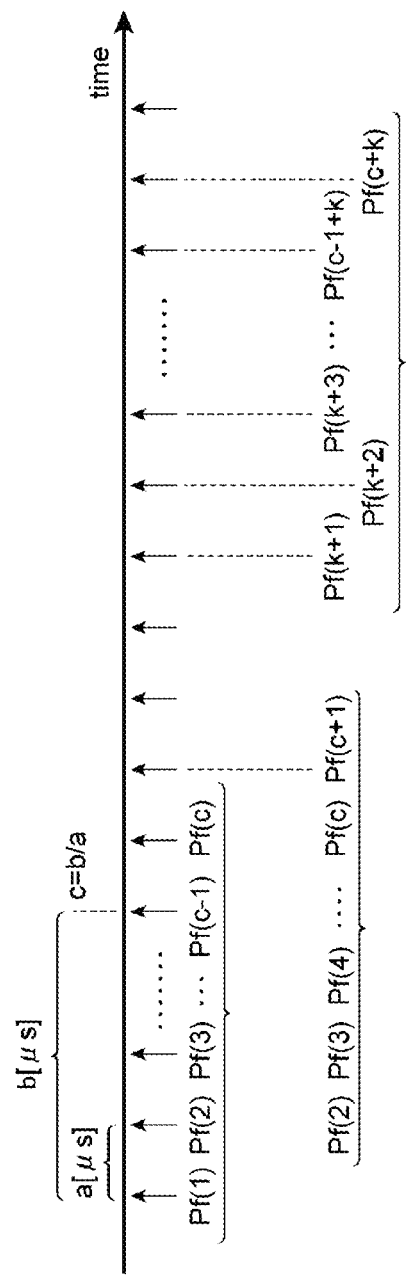
FIG. 11 is a diagram for describing an example of a moving average.

The measurement controller 167 may average the data to accurately measure the progressive wave power which is pulse-modulated. FIG. 11 is a diagram illustrating an example of a moving average. In FIG. 11, a denotes a sampling interval [μs]; b, a moving average time [μs]; and c, a number of samples. Further, the sampling interval is equal to or less than 0.1 μs. The number of the samples c is represented by b/a. At a time (t) of zero, the measurement controller 167 acquires c-number of samples from Pf(1) to Pf(c) at the sampling interval a, and averages them. At a time (t) of 1, the measurement controller 167 acquires c-number of samples from Pf(2) to Pf(c+1) at the sampling interval a, and averages them. At a time (t) of k, the measurement controller 167 acquires c-number of samples from Pf(k+1) to Pf(c+k) at the sampling interval a, and averages them. These are represented by the following expression.

$$\text{when } t = 0, \quad Pf(t) = \frac{1}{c}\sum_{n=1}^{c} pf(n) \quad \text{[Expression 1]}$$

$$\text{when } t = 1, \quad Pf(t) = \frac{1}{c}\sum_{n=1}^{c} pf(n+1)$$

$$\text{when } t = k, \quad Pf(t) = \frac{1}{c}\sum_{n=1}^{c} pf(n+k)$$

Accordingly, the waveform of the power having strength and weakness is averaged.

Though the example of the progressive wave has been described in the above example, the reflection wave can be averaged in the same manner. As stated above, the measurement controller 167 measures the first High measurement value pfH, the first Low measurement value pfL, the second High measurement value prH, and the second Low measurement value prL, and outputs the measurement results to the controller 162a. That is, the measurement controller 167 averages each of these measurement values.

In the example shown in FIG. 9C, the first High measurement value pfH is averaged by the following expression.

$$PfH(t) = \frac{1}{m}\sum_{k=1}^{m} pfH(k) \quad \text{[Expression 2]}$$

In the example shown in FIG. 9D, the first Low measurement value pfL is averaged by the following expression.

$$PfL(t) = \frac{1}{n}\sum_{k=1}^{n} pfL(k) \quad \text{[Expression 3]}$$

In the example shown in FIG. 10C, the second High measurement value prH is averaged by the following expression.

$$PrH(t) = \frac{1}{m}\sum_{k=1}^{m} prH(k) \quad \text{[Expression 4]}$$

In the example shown in FIG. 10D, the second Low measurement value prL is averaged by the following expression.

$$PrL(t) = \frac{1}{n}\sum_{k=1}^{n} prL(k) \quad \text{[Expression 5]}$$

As stated above, the measurement device 16k performs the averaging processing for each measurement value. Further, the measurement device 16k averages, between the first High measurement value pfH and the first Low measurement value pfL, the measurement value corresponding to the microwave of the BB waveform with a moving average time equal to or larger than a reciprocal of the set carrier pitch and a predetermined sampling number. As an example, when the carrier pitch is 10 kHz, the reciprocal of the set carrier pitch is 100 μs, and this becomes a cycle of the BB waveform. Thus, the measurement device 16k sets the moving average time to be equal to or larger than 100 μs, and performs the averaging processing. As an example, when the sampling interval a is 10 ns, the sampling number is set to be equal to or larger than 10000 times. Accordingly, it is possible to carry out the averaging processing for the BB waveform appropriately.

The measurement device 16k averages, between the first High measurement value pfH and the first Low measurement value pfL, the measurement value corresponding to the microwave of the SP waveform with a moving average time smaller than the reciprocal of the set carrier pitch and a predetermined sampling number. On the time axis, the power of the SP waveform is constant. Thus, the measurement device 16k needs to perform the averaging processing to the extent that a noise can be removed. As an example, the measurement device 16k averages the power with a moving average smaller than the moving average time of 100 μs which is set for the BB waveform. As a more specific example, the measure 16k averages the power with a moving average time ranging from 1 us to 60 us inclusive.

As stated above, the measurement device 16k sets the moving average for the BB waveform and the moving average for the SP waveform to be different from each other. Accordingly, the microwave output deice 16 is capable of carrying out the power control at a high speed, as compared to the case where the entire microwave is averaged by a moving average time corresponding to the BB waveform (i.e., a moving average time equal to or larger than the cycle of the BB waveform).

[Example of Result of Samplings]

FIG. 12A to FIG. 12F present waveforms showing examples of samplings performed by the measurement device. FIG. 12A shows a pulse-modulated SP waveform, which is measured by the first directional coupler 16f. FIG. 12B shows a waveform obtained by sampling the SP waveform of FIG. 12A with the measurement controller 167. As shown in FIG. 12A and FIG. 12B, in the pulse-modulated SP waveform, High signals and Low signals can be distinguished clearly after the sampling. FIG. 12C presents a pulse-modulated BB waveform, which is measured by the first directional coupler 16f. FIG. 12D shows a waveform obtained by sampling the BB waveform of FIG. 12C with the measurement controller 167. As depicted in FIG. 12C and FIG. 12D, in the pulse-modulated BB waveform, High signals and Low signals cannot be distinguished clearly after the sampling. FIG. 12E shows a pulse-modulated waveform, which is measured by the first directional coupler 16f, and the SP waveform and the BB waveform appear alternately in this waveform. FIG. 12F presents a waveform obtained by sampling the waveform of FIG. 12E by the measurement controller 167. As depicted in FIG. 12E and FIG. 12F, in the waveform in which the SP waveform and the BB waveform appear alternately, High signals and Low signals can be distinguished clearly after the sampling.

[Example of time chart]

Figure 13A:
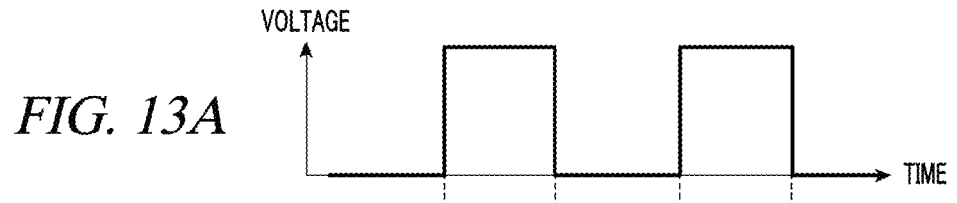
FIG. 13A to FIG. 13D present time charts of a synchronization signal, a waveform where a SP waveform and a BB waveform appear alternately, a pulse-modulated waveform, and a sampled waveform, respectively.
Figure 13B:
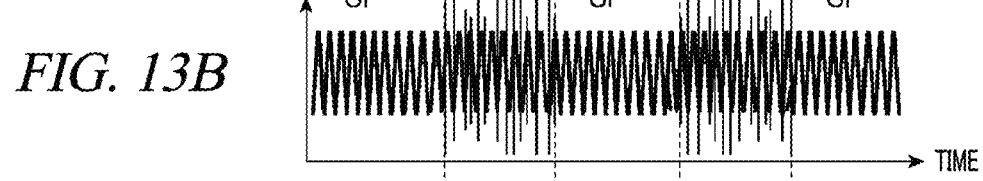
Figure 13C:
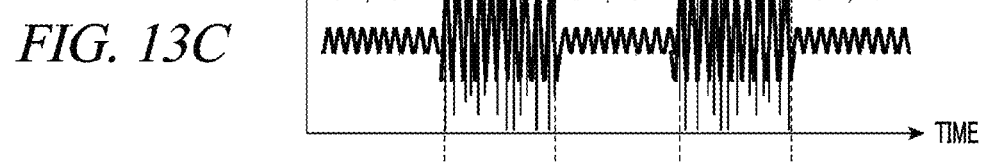
Figure 13D:
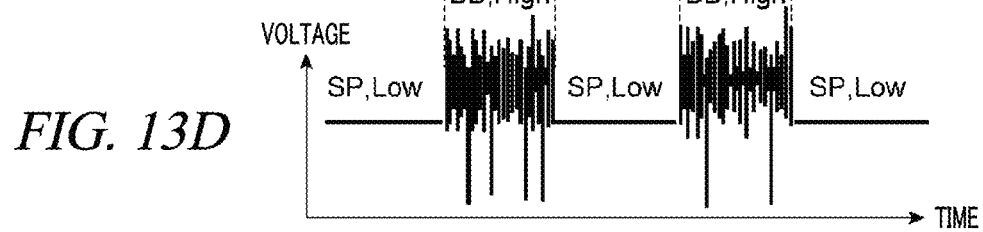

The synchronization signal, the waveform in which the SP waveform and the BB waveform appear alternately, the pulse-modulated waveform, and the sampled waveform as described above are illustrated in FIG. 13A to FIG. 13D on the same time axis. FIG. 13A to FIG. 13D are time charts of the synchronization signal, the waveform in which the SP waveform and the BB waveform appear alternately, the pulse-modulated waveform, and the sampled waveform. FIG. 13A shows the synchronization signal PSS-M generated by the first pulse generator 102. FIG. 13B shows the waveform generated by the waveform generator 101. FIG. 13C shows the pulse-modulated waveform by the control unit 162a. FIG. 13D presents the waveform sampled by the measurement controller 167.

As shown in FIG. 13B, the SP waveform and the BB waveform appear alternately in synchronization with ON/OFF of the synchronization signal PSS-M. That is, the cycle and the duty ratio of the waveform shown in FIG. 13B coincide with the cycle and the duty ratio of the synchronization signal PSS-M. As illustrated in FIG. 13C, the powers of the SP waveform and the BB waveform are modulated while being distinguished from each other, in synchronization with ON/OFF of the synchronization signal PSS-M as shown in FIG. 13A. That is, the cycle and the duty ratio of the waveform shown in FIG. 13C coincide with the cycle and the duty ratio of the synchronization signal PSS-M. Further, as shown in FIG. 13D, High portions and Low portions of the microwave are detected while being distinguished from each other.

So far, the various exemplary embodiments have been described. However, the exemplary embodiments are not limiting, and various omissions, substitutions and changes may be made. Further, other exemplary embodiments may be embodied by combining elements in the various exemplary embodiments in a variety of other forms.

Though the above exemplary embodiments have been described for the example where the microwave generator 16a and the waveform generator 101 are separated, they may be configured as a single apparatus. Further, though the above exemplary embodiments have been described for the example where the operation device 100a includes the first pulse generator 102 to the fourth pulse generator 105, the exemplary embodiments are not limited thereto. By way of example, the power controller 162 may have the first pulse generator 102.

If the plasma processing apparatus uses only a mode in which the progressive wave power of the microwave is used, the measurement device 16k may not be equipped with the components for measuring the reflection wave.

When the microwaves of the BB waveform and the SP waveform are repeated alternately in the pulse modulation, medial frequencies of the High level and the Low level may be same or different. Further, in the setting of the apparatus, it may be possible to set the apparatus to perform the pulse modulation of only the SP waveform. At this time, only the median frequencies of the High and Low levels may be alternately changed repeatedly.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

According to the exemplary embodiments, it is possible to provide a technique capable of easily monitoring the pulse frequency and the duty ratio of the microwave pulse-modulated, and also capable of increasing a speed of the control over the power of the microwave.

We claim:

1. A plasma processing apparatus, comprising:
a chamber main body; and
a microwave output device configured to output a microwave for exciting a gas supplied into the chamber main body,
wherein the microwave output device comprises:
a microwave generator configured to generate a microwave a power of which is pulse-modulated such that the power of the microwave has a pulse frequency, a duty ratio, a high level and a low level according to a set pulse frequency, a set duty ratio, a set power of high level and a set power of low level instructed from a controller;
an output unit configured to output the microwave propagated from the microwave generator;
a first directional coupler configured to output a part of a progressive wave propagated to the output unit from the microwave generator; and
a measurement device configured to determine, based on the part of the progressive wave outputted from the first directional coupler, a first high measurement value and a first low measurement value respectively indicating a high level and a low level of a power of the progressive wave in the output unit,
wherein the microwave generator is configured to alternately generate a microwave of a first waveform and a microwave of a second waveform in synchronization with switching of the high level and the low level of the power, the microwave of the first waveform having a median frequency, a bandwidth and a carrier pitch according to a set frequency, a set bandwidth and a set carrier pitch instructed from the controller, respectively, and the microwave of the second waveform having a single frequency peak at a median frequency according to the set frequency instructed from the controller,
the measurement device averages, between the first high measurement value and the first low measurement value, the measurement value corresponding to the microwave of the first waveform with a moving average time equal to or larger than a reciprocal of the set carrier pitch and a preset sampling number,
the measurement device averages, between the first high measurement value and the first low measurement value, the measurement value corresponding to the microwave of the second waveform with a moving average time less than the reciprocal of the set carrier pitch and a preset sampling number,
the microwave generator controls the power of high level of the pulse-modulated microwave based on the averaged first high measurement value and the set power of high level, and
the microwave generator controls the power of low level of the pulse-modulated microwave based on the averaged first low measurement value and the set power of low level.

2. The plasma processing apparatus of claim 1, further comprising:
a second directional coupler configured to output a part of a reflection wave returned to the output unit,
wherein the measurement device further determines, based on the part of the reflection wave outputted from the second directional coupler, a second high measurement value and a second low measurement value respectively indicating a high level and a low level of a power of the reflection wave in the output unit,
the measurement device averages, between the second high measurement value and the second low measurement value, the measurement value corresponding to the microwave of the first waveform with a moving average time equal to or larger than the reciprocal of the set carrier pitch and a preset sampling number,
the measurement device averages, between the second high measurement value and the second low measurement value, the measurement value corresponding to the microwave of the second waveform with a moving average time less than the reciprocal of the set carrier pitch and a preset sampling number,
the microwave generator controls the power of high level of the pulse-modulated microwave based on the averaged first high measurement value, the averaged second high measurement value and the set power of high level, and
the microwave generator controls the power of low level of the pulse-modulated microwave based on the averaged first low measurement value, the averaged second low measurement value and the set power of low level.

3. The plasma processing apparatus of claim 2,
wherein the microwave generator controls the microwave such that a value obtained by subtracting the averaged second high measurement value from the averaged first high measurement value approaches the set power of high level, and
the microwave generator controls the microwave such that a value obtained by subtracting the averaged second low measurement value from the averaged first low measurement value approaches the set power of low level.

* * * * *